United States Patent
Lin et al.

(10) Patent No.: US 10,200,066 B2
(45) Date of Patent: Feb. 5, 2019

(54) CODE RECONSTRUCTION SCHEME FOR MULTIPLE CODE RATE TPC DECODER

(71) Applicant: SK Hynix Inc., Gyeonggi-do (KR)

(72) Inventors: Yi-Min Lin, San Jose, CA (US); Aman Bhatia, San Jose, CA (US); Naveen Kumar, San Jose, CA (US); Johnson Yen, Fremont, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/433,850

(22) Filed: Feb. 15, 2017

(65) Prior Publication Data

US 2017/0264320 A1    Sep. 14, 2017

Related U.S. Application Data

(60) Provisional application No. 62/305,971, filed on Mar. 9, 2016.

(51) Int. Cl.
*H03M 13/29* (2006.01)
*H03M 13/15* (2006.01)
*H03M 13/00* (2006.01)

(52) U.S. Cl.
CPC ..... *H03M 13/2963* (2013.01); *H03M 13/152* (2013.01); *H03M 13/1545* (2013.01); *H03M 13/618* (2013.01); *H03M 13/6516* (2013.01)

(58) Field of Classification Search
CPC .................................................. H03M 13/2957
USPC ......................................... 714/755, 757, 752
See application file for complete search history.

(56) References Cited

U.S. PATENT DOCUMENTS

| | | | |
|---|---|---|---|
| 5,729,560 A | 3/1998 | Hagenauer et al. | |
| 6,763,494 B2 | 7/2004 | Hewitt | |
| 2005/0018635 A1 | 1/2005 | Proctor, Jr. | |
| 2005/0283707 A1* | 12/2005 | Sharon | H03M 13/1137 714/758 |
| 2007/0147567 A1 | 1/2007 | Thesling | |
| 2009/0113276 A1* | 4/2009 | Radosavljevic | H03M 13/1137 714/801 |
| 2014/0181622 A1 | 6/2014 | Proctor, Jr. | |
| 2015/0363262 A1* | 12/2015 | Hu | G06F 11/1048 714/773 |
| 2018/0054278 A1* | 2/2018 | Shi | H03M 13/45 |

* cited by examiner

*Primary Examiner* — Fritz Alphonse
(74) *Attorney, Agent, or Firm* — Kilpatrick Townsend Stockton LLP

(57) ABSTRACT

An apparatus for decoding is disclosed. The apparatus includes a memory and a processor coupled to the memory. The processor is configured to obtain a first codeword comprising one or more information bits and one or more parity bits, obtain a first parameter corresponding to a code rate of the first codeword, and decode the first codeword using a multi-rate decoder to generate a decoded codeword. The multi rate decoder performs a code reconstruction procedure on the first codeword to generate a reconstructed codeword, and decodes the reconstructed codeword. The processor is further configured to output the decoded codeword.

20 Claims, 12 Drawing Sheets

CODE RECONSTRUCTION SCHEME FOR MULTIPLE CODE RATE TPC DECODER

CROSS-REFERENCE TO RELATED APPLICATIONS

The present application claims priority to Provisional Application No. 62/305,971 entitled "Code Reconstruction Scheme For Multiple Code Rate TPC Decoder," filed Mar. 9, 2016, which is assigned to the assignee hereof and expressly incorporated by reference herein in its entirety.

TECHNICAL FIELD

The present disclosure relates generally to error correcting codes, and in particular, to turbo product code construction for efficient decoding.

BACKGROUND

Error Control Coding (ECC) schemes are essential in data storage applications to provide data integrity. Reliability of storage systems such as NAND flash memories may decline as higher storage density is achieved with multi-level cell (MLC)/triple-level cell (TLC) technologies. Different ECC schemes can be used to detect and correct the errors and improve the reliability of these systems. The ECC codes may include low-density parity-check (LDPC) codes, Bose-Chaudhuri-Hocquenghem (BCH) codes, turbo product codes (TPCs), and the like.

TPC codes are a promising ECC candidate for storage applications. TPC decoding is usually performed by iteratively decoding one or more of the constituent codewords in a TPC code. In general, TPC decoder could provide better hardware complexity and power consumption performance than LDPC decoder. However, for applications in which the TPC decoder is required to support multiple code rates, hardware complexity of the TPC decoder increases. In an LDPC decoder, most of the hardware blocks can be reused to support different code rates. However, TPC decoders are usually customized for a specific code rate. In conventional systems, in order to support different TPC code rates, several hardware components are duplicated and customized for each code rate. There is a need in the art for low complexity TPC decoders that support multiple code rates.

SUMMARY

Systems, methods, and computer-readable storage media that implement techniques for decoding a codeword are disclosed. In an example, the techniques involve obtaining a first codeword comprising one or more information bits and one or more parity bits, obtaining a first parameter corresponding to a code rate of the first codeword, and decoding the first codeword using a multi-rate decoder to generate a decoded codeword. The multi rate decoder performs a code reconstruction procedure on the first codeword to generate a reconstructed codeword, and decodes the reconstructed codeword. The techniques further include outputting the decoded codeword.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1:
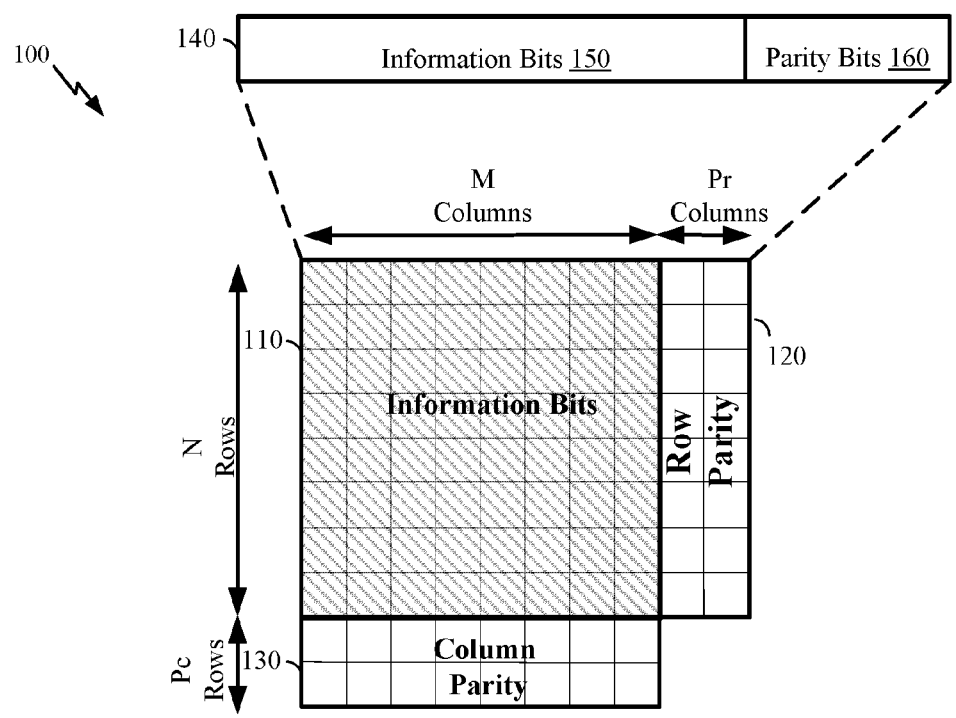
FIG. 1 illustrates an example block diagram of a turbo product code (TPC) codeword, in accordance with certain embodiments of the present disclosure.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

TPC decoders can generally provide much better hardware complexity and power consumption performance than LDPC decoder. However, the row/column parity size for TPC codes with different code rates is different, resulting in code construction misalignment between codewords while supporting different code rates. The misalignment of the codewords increases the hardware overhead. Certain embodiments disclose an efficient TPC decoder that supports multiple code rates. In one embodiment, a method is disclosed to reconstruct codewords corresponding to the constituent codes in each dimension. Furthermore, an efficient code reconstruction method for third dimension codewords in a three-dimensional TPC code is disclosed for additional hardware saving.

The term "error correcting code (ECC)" is used herein to refer to a codeword that is generated by a process of adding redundant data, or parity data, to a message, such that it can be recovered by a receiver even when a number of errors are introduced, either during the process of transmission, or storage. In general, ECC decoding can correct one or more errors up to the capability of the code being used. Error-correcting codes are frequently used in communications, as well as for reliable storage in storage systems such as CDs, DVDs, hard disks, and random access memories (RAMs), flash memories, and the like. Error correcting codes may include turbo product codes (TPC), low density parity check codes (LDPC), Bose-Chaudhuri-Hocquenghem (BCH) codes, Reed Solomon codes, and the like.

Turbo product codes are a promising candidate for correcting errors in storage applications. Turbo product codes may include two or more dimensions, each of which corresponding to a class of error correcting codes, such as BCH codes, Reed Solomon codes, or the like. The ECC code corresponding to each dimension of the TPC code is referred to herein as a constituent code. In one example, a two-dimensional TPC codeword may include one or more error correcting codewords (e.g., BCH codewords) corresponding to its first dimension, and one or more error correcting codewords corresponding to its second dimension.

TPC codes may be decoded by performing an iterative decoding procedure on the constituent codewords in one or more dimensions. As an example, for decoding a TPC code with BCH constituent codes, the TPC decoder performs BCH decoding on one or more codewords in the first dimension and one or more codewords in the second dimension of the TPC code. The TPC decoder may iteratively continue the decoding process until either a correct codeword is found or decoding failure is declared.

The term "hard decision" is used herein to refer to a bit that comprises a "0" or a "1" value, and is associated with a particular location within a codeword. A "hard decision" may also be referred to as a "hard output" or "hard information." In some embodiments, the reliability of each hard decision may be known. The "reliability" of a hard decision refers to a probability (e.g., a value from "0" through "1") that the corresponding hard decision is correct. A "reliability" may also be referred to as "soft information" or a "soft output." In a NAND channel, a reliability for each bit may be obtained, for example, by multiple read operations from the NAND memory using different thresholds. In general, if the hard decision decoding of a codeword fails, soft information can be used to decode the failed codeword using soft decoding techniques, such as Chase decoding.

It should be noted that although BCH codes are used as an example to explain the proposed methods, the code reconstruction and multi-rate decoding architecture disclosed herein is not limited to BCH and/or TPC codes and can be applied to any other class of error correcting codes.

FIG. 1 illustrates an example block diagram of a TPC codeword, in accordance with certain embodiments of the present disclosure. As illustrated, the TPC codeword 100 may be a matrix of size $(N+P_c) \times (M+P_r)$, in which N represents number of rows of information bits, M represents number of columns of information bits, $P_r$ represents number of row parity bits, and $P_c$ represents number of column parity bits. Information bits can be represented by a matrix of size N×M (e.g., matrix 110), row parity bits can be represented by a matrix of size N×$P_r$ (e.g., matrix 120), and column parity bits may be represented by a matrix of size $P_c$×M (e.g., matrix 130). The TPC codeword may include N codewords corresponding to its first dimension (e.g., row codewords), and M codewords corresponding to its second dimension (e.g., column codeword). Each row codeword 140 includes multiple information bits 150 and one or more parity bits 160. Similarly, each column codeword includes multiple information bits and one or more parity bits. As an example, if BCH codes are used as row constituent codes, the row codewords 1 through N are constructed using BCH encoding. Similarly, column codewords 1 through M are generated using an error correcting constituent code (e.g., BCH code, Reed Solomon code, etc.).

As an example, if the row constituent code has a code rate of 0.9, the row codeword may include 90 information bits and 10 parity bits. In general, row codewords and column codewords may have any code rate, without departing from the teachings of the present disclosure. To obtain the row and column parity bits, a TPC encoder (not shown) first encodes the N rows of information bits (shown as shaded blocks) to generate the N row parity bit groups. Then, the TPC encoder encodes the M columns of information bits to generate the M column parity bit sets.

Figure 2:
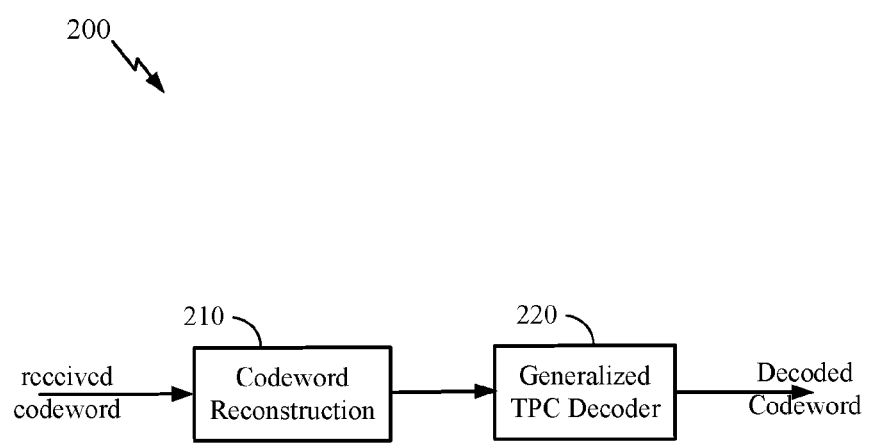
FIG. 2 illustrates an example multi-rate TPC decoder 200, in accordance with certain embodiments of the present disclosure.

FIG. 2 illustrates an example multi-rate TPC decoder 200, in accordance with certain embodiments of the present disclosure. As illustrated, the multi-rate TPC decoder 200 includes a code reconstruction block 210 and a generalized TPC decoder 220. The code reconstruction block 210 reconstructs each codeword using the method proposed herein to generate an intermediate TPC codeword. The intermediate TPC codeword then is passed to the generalized TPC decoder to be decoded. In one embodiment, the generalized TPC decoder may be designed to support decoding of a predefined TPC code. The pre-defined TPC code is referred to herein as the "base code." In general, the base code can be decoded with the generalized TPC decoder without any code reconstruction. In one example, the base code may be a TPC code with the lowest supported code rate in the multi-rate decoder. Each of the codewords that correspond to code rates other than the code rate of the base code are reconstructed before entering the generalized TPC decoder for decoding.

Figure 3A:
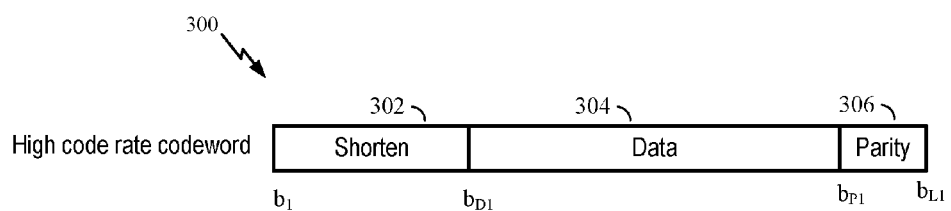
FIGS. 3A and 3B illustrate example constituent codewords with different code rates, in accordance with certain embodiments of the present disclosure.
Figure 3B:

FIGS. 3A and 3B illustrate example constituent codewords with different code rates, in accordance with certain embodiments of the present disclosure. In this example, BCH constituent codewords are considered. However, the TPC code, in general, can have any type of constituent codes without departing from the teachings of the present disclosure. The methods presented herein are not limited to BCH codes and can be used with TPC codes with any type of constituent codes. FIG. 3A illustrates a BCH codeword 300 with a high code rate (e.g., 0.9). As illustrated, the BCH codeword may include shortened bits 302, data bits 304, and parity bits 306. It should be noted that a BCH codeword may or may not have shortened bits. The shortened bits are generally equal to zero.

FIG. 3B illustrates a BCH codeword 310 with a low code rate (e.g., 0.8). As illustrated, the BCH codeword 310 includes shortened bits 312, data bits 314, and parity bits 316. In this example, both codewords 300 and 310 protect the same number of data bits. However, number of parity bits in codeword 300 (e.g., parity bits 306) is smaller than the number of parity bits in codeword 310 (e.g., parity bits 316). Therefore, correction capability of the codeword 300 is smaller than the correction capability of the codeword 310. As can be seen, in the codewords in FIGS. 3A and 3B, start and end of the data bits are not aligned. For example, the data bits in codeword 300 start at bit location $b_{d1}$ and end at bit location $b_{p1-1}$. The parity bits in codeword 300 start at bit location $b_{p1}$ and end at bit location $b_{L1}$. Similarly, the data bits in codeword 310 start at bit location $b_{d2}$ and end at bit location $b_{p2-1}$. The parity bits in codeword 310 start at bit location $b_{p2}$ and end at bit location $b_{L2}$. In this example, $b_{d1}$ differs from $b_{d2}$. Therefore, there is a misalignment between the starting point of the data blocks in the two codewords. It should be noted that this misalignment increases complexity of the hardware implementation of a multi-rate TPC decoder, if it is not accounted for.

Certain embodiments disclose a code reconstruction method to align the codewords with different code rates. The code reconstruction method takes advantage of the cyclic property of the BCH codes. In one embodiment, a code reconstruction block 210 shifts each BCH codeword in a TPC codeword cyclically to align the BCH codeword with a base BCH codeword. The base BCH codeword may correspond to one of the constituent codes in the base TPC code, as explained in FIG. 2.

Figure 4A:
FIGS. 4A and 4B illustrate example reconstructed constituent codewords, in accordance with certain embodiments of the present disclosure.
Figure 4B:
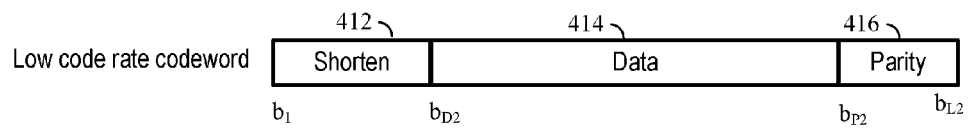

FIGS. 4A and 4B illustrate an example reconstructed constituent codeword and a base codeword, in accordance with certain embodiments of the present disclosure. FIG. 4A illustrates a reconstructed BCH codeword 400 with a high code rate. As illustrated, the BCH codeword 400 includes shortened bits 402 and 408, data bits 404, and parity bits 406. The BCH codeword illustrated in FIG. 4A is cyclically shifted version of the BCH code in FIG. 3A. Therefore, total number of the shortened bits 402 and 408 is equal to the number of shortened bits 302. The codeword 300 is cyclically shifted to the left to generate codeword 400.

FIG. 4B illustrates a BCH codeword 410 with a low code rate. In this example, the codeword 410 is considered to be the base code. As illustrated, the BCH codeword 410 includes shortened bits 412, data bits 414, and parity bits 416. The codeword in FIG. 4B is similar to the codeword shown in FIG. 3B. As can be seen the starting point of the data bits 404 and 414 are aligned in both codewords 400 and 410. Similarly, starting point of the parity bits 406 and 416 are aligned in both codewords 400 and 410. However, since codeword 400 has a higher rate (and hence smaller number of parity bits than codeword 410, the ending point of the parity bits 406 and 416 do not match. In this example, cyclically shifted shortened bits make up the difference between the parity bits in the two codewords.

It should be noted that a multi-dimensional TPC code may support N code rates. In this case, each of the constituent codes are cyclically shifted to align starting point of their data blocks with a data block of the base code before decoding the codes. The amount of shift for each constituent code is determined based on the code rate of the constituent code and code rate of the base code. In one embodiment, a constituent code with the lowest code rate may be considered as a base code. Other constituent codes may be cyclically shifted to align starting point of their data bits with the base code.

Figure 5:
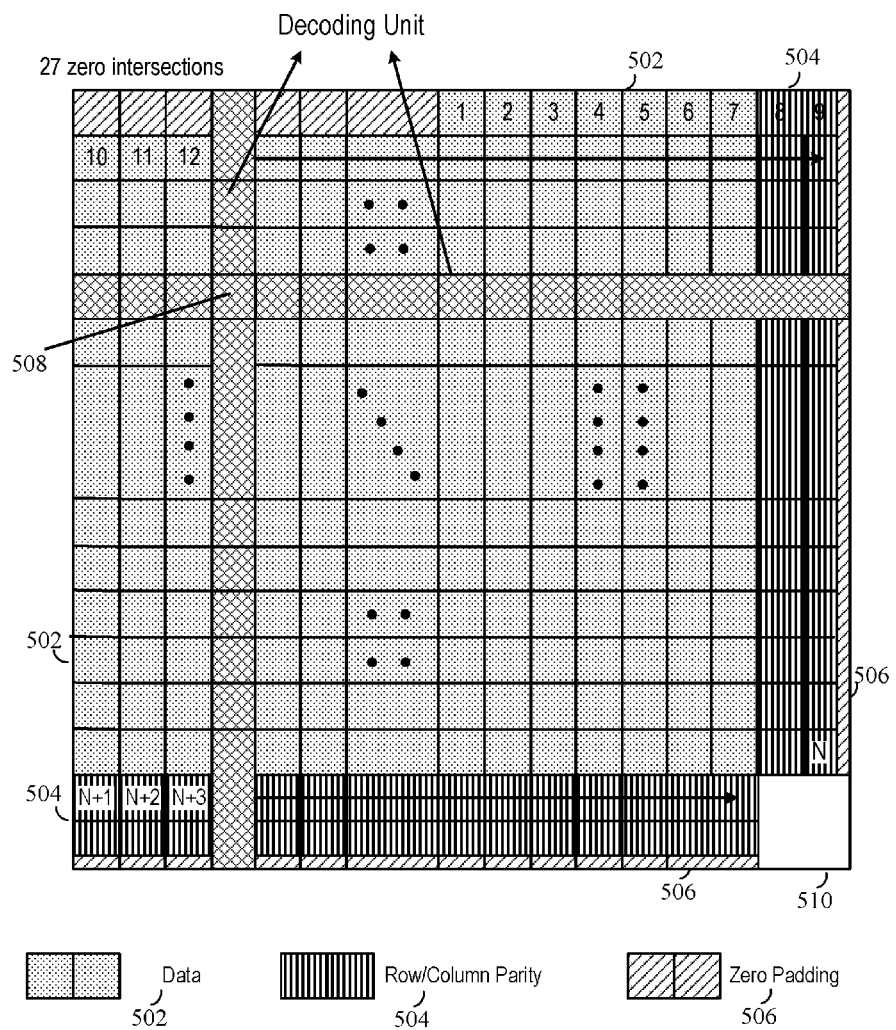
FIG. 5 illustrates an example block diagram of a two-dimensional TPC codeword based on reconstructed constituent codes, in accordance with certain embodiments of the present disclosure.

In one embodiment, the codeword length of different constituent codewords with different code rates may be modified (by adding shortened bits) to match a predefined codeword length. For example, the codeword length L may be equal or greater than the length of the base code. In addition, in order to improve hardware efficiency, the codeword length may be considered to be a multiple of the intersection size. As shown in FIG. 5, a cross block of one or more rows and one or more columns is referred to as an "intersection."

FIG. 5 illustrates an example block diagram of a two-dimensional TPC codeword based on reconstructed constituent codes, in accordance with certain embodiments of the present disclosure. As illustrated, the two-dimensional code includes data bits 502, parity bits 504, and zero bits 506. In one example, the zero bits are used for zero padding the codewords to align sizes of different TPC codes with different code rates. The zero bits may also be used/added to the code for any other reason without departing from the teachings of the present disclosure. In addition, the intersection 508 is shown as the intersection of one or more row codewords and one or more column codewords. In one example, size of the intersection may be equal to eight bits. Any other size may also be used without departing from the teachings of the present disclosure. In one embodiment, size of the intersection of the first and second dimension codewords are used as a basis for the processing units in the hardware architecture. For example, each processing unit may process eight bits in parallel. In one embodiment, memory bandwidth is a multiple of the intersection size. For example, if memory bandwidth is 64 bits, size of the processing unit may be 8, 16, or any other sizes.

In one embodiment, number of zero bits at the end of each constituent code may be determined based on the supported code rates and block lengths in the TPC architecture. For example, if the decoder architecture supports constituent codes with three code rates R1, R2 and R3. Assume that the constituent codewords encode 100 data bits. The first code adds 5 parity bits, the second code adds 10 parity bits and the third code adds 15 parity bits. If an intersection size is 8 bits, all the codes may be zero padded to generate block lengths of, for example, 120 bits. In this example, the first code may be zero padded and with 15 zero bits, the second code may be padded with 10 zero bits and the third bits may be padded with 5 zero bits.

Reconstruction for Third Codewords

One embodiment discloses a three-dimensional TPC code in which the third dimension constituent codes protect most or all of the data and parity bits corresponding to the first and second dimensions. In one embodiment, an interleaving scheme may be utilized to interleave the information bits and/or the row/column parity bits before generating the parity bits corresponding to the third dimension.

Figure 6:
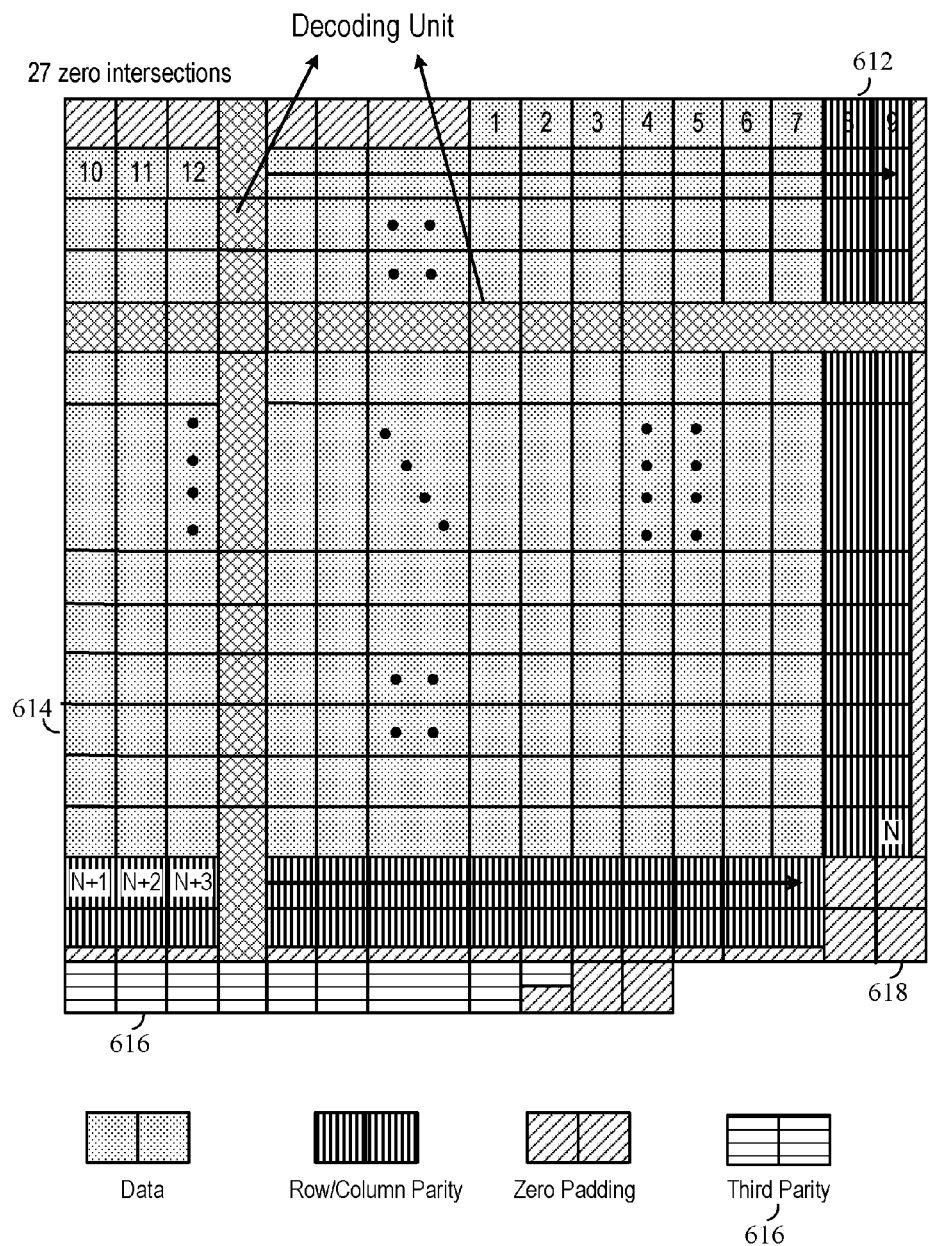
FIG. 6 illustrates an example block diagram of a three-dimensional TPC codeword based on reconstructed constituent codes, in accordance with certain embodiments of the present disclosure.

FIG. 6 illustrates an example block diagram of a three-dimensional TPC codeword based on reconstructed constituent codes, in accordance with certain embodiments of the present disclosure. In this figure, the TPC code has three sets of parity bits, each corresponding to one of the dimensions. For example, parity bits 612 correspond to the first dimension, parity bits 614 correspond to the second dimension and the parity bits 616 correspond to the third dimension.

As can be seen in FIG. 5, the right bottom corner portion of the TPC code matrix (block 510), in conventional TPC design does not include any bits. However, this may make the interleaving scheme irregular. In one embodiment, complexity of the interleaver is reduced by padding zeros in the right bottom portion of the TPC code matrix (block 618).

Figure 7:
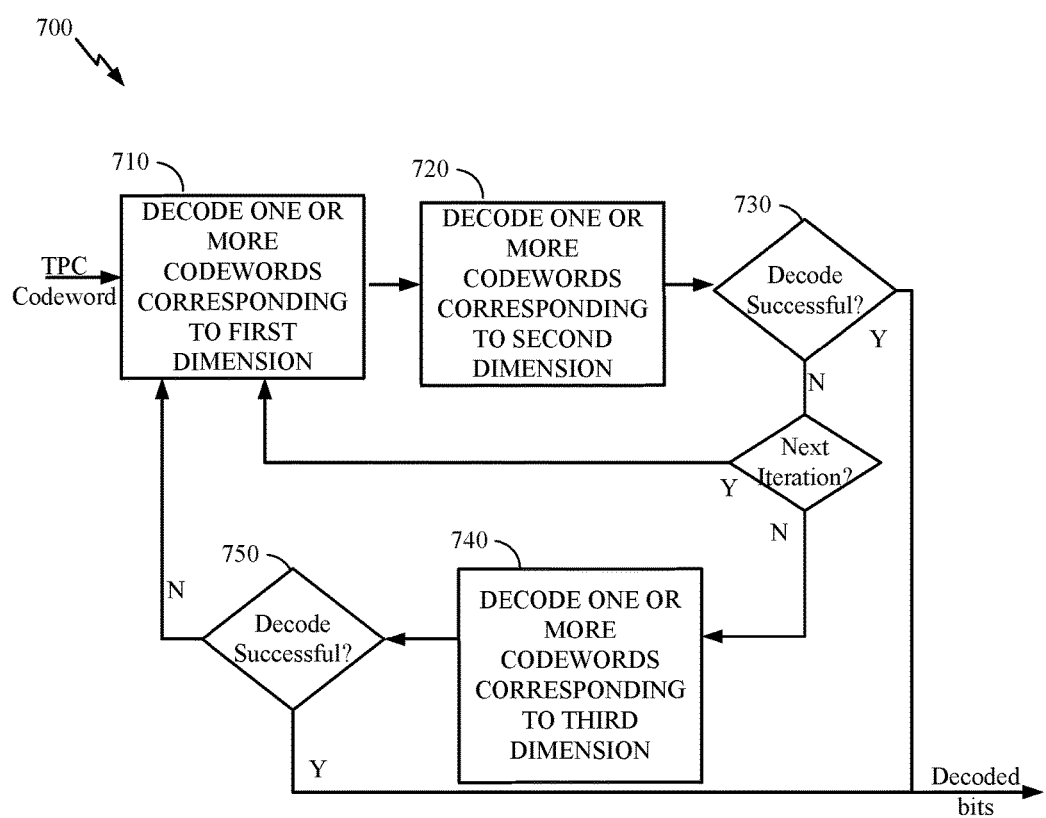
FIG. 7 illustrates an example three-dimensional TPC decoder, in accordance with certain embodiments of the present disclosure.

FIG. 7 illustrates an example three-dimensional TPC decoder, in accordance with certain embodiments of the present disclosure. The three-dimensional TPC decoder may be used as the generalized TPC decoder in FIG. 2. The TPC decoder may perform decoding on one or more of the constituent codes corresponding to the first dimension, the second dimension and/or third dimension iteratively to generate a correct TPC codeword. First, the decoder receives a TPC codeword. At 710, the TPC decoder decodes one or more codewords corresponding to first dimension constituent code (e.g., row codeword) in the received TPC codeword. As an example, for the TPC codeword as illustrated in FIG. 1, the decoder may decode one or more of the N row codewords. In one example, if each of the row constituent codewords is a BCH codeword, the TPC decoder performs BCH decoding (as described in FIG. 8) on each of the row codewords.

In general, the TPC decoder may include any number of BCH decoder blocks, without departing from the teachings of the present disclosure. As an example, depending on throughput and size requirements of a the TPC decoder, the TPC decoder may utilize a single BCH decoder block to decode the N row codewords sequentially. Alternatively, the TPC decoder may include N BCH decoder blocks that run in parallel to decode N row codewords in parallel. In another embodiment, the TPC decoder may include K BCH decoder blocks, 1<K<N that run in parallel. The TPC decoder may utilize the K decoder blocks one or more times to decode some or all the row codewords. In one example, N=30 and K=2.

At 720, the decoder may decode one or more codewords corresponding to the second dimension constituent code. For example, the decoder may decode one or more of the M column codewords. In one example, if each of the column codewords is a BCH codeword, the TPC decoder performs BCH decoding on each of the column codewords. At 730, the decoder checks if decoding has been successful or not. If TPC decoding has been successful, the decoding stops and the decoder outputs the decoded bits. If the TPC decoding has not been successful (e.g., the decoder did not converge to a correct codeword), the TPC decoder may iteratively continue decoding on the first dimension and/or second dimension codewords to correct errors. Alternatively, at 740, the TPC decoder may decode one or more codewords corresponding to the third dimension. At 750, the TPC decoder checks if the decoding has been successful or not. If decoding process has been successful, the decoded bits are output from the decoder. If the decoding process has not been successful, the TPC decoder may perform another round of decoding on the first, second and/or third dimensions of the decoder to find a correct codeword. If the decoder reaches a maximum number of iterations, the decoding process may stop even if a correct codeword is not found. Without loss of generality, the TPC decoder in FIG. 7 has three dimensions. However, the TPC decoder, in general, may include any number of dimensions without departing from the teachings of the present disclosure.

Figure 8:
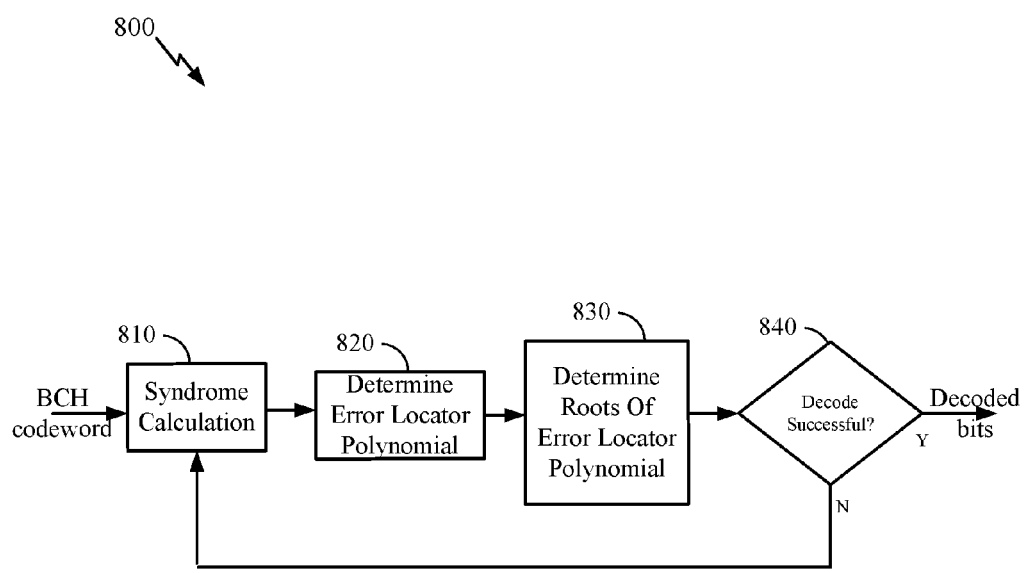
FIG. 8 illustrates an example Bose-Chaudhuri-Hocquenghem (BCH) hard decoder, in accordance with certain embodiments of the present disclosure.

FIG. 8 illustrates a high-level diagram an example Bose-Chaudhuri-Hocquenghem (BCH) hard decoder, in accordance with certain embodiments of the present disclosure. As illustrated, the decoder receives a BCH codeword and starts an iterative decoding process. For each iteration, BCH decoder performs syndrome calculation (step 810) on the received codeword, determines error locator polynomial (step 820), and performs Chien search or similar procedures to determine roots of error locator polynomial (step 830). Roots of the error locator polynomial provide an indication of where the errors in the codeword are located.

After correcting the errors, at 840, the decoder checks if the decoding process has resulted in a correct codeword. If yes, the decoder outputs the decoded bits. If not, the decoder may generate a bit flipping pattern, flip one or more bits of the codeword based on the pattern and calculate syndrome values of the new codeword. The decoding process may continue until a correct codeword is found and/or a predetermined maximum number of iterations is reached.

Given the natural numbers m and t, a t-error correcting binary BCH code of length $n=2^m-1$ may be defined as: $c(x) \in GF(2)[x]$: deg $c(x) \leq n-1$, $c(\alpha)=c(\alpha^2)=c(\alpha^3)= \ldots =c(\alpha^{2t})=0$ where $\alpha \in GF(2^m)$ is a primitive element. In other words, it is the set of all binary polynomials of degree at most n−1 such that when these are treated as polynomials over $GF(2^m)$, they must have $\alpha, \alpha^2, \alpha^3, \alpha^{2t}$ as their roots.

If c(x) is the transmitted codeword, e(x) is the error polynomial, and R(x)=c(x)+e(x) is the received codeword, then given that $\alpha, \alpha^2, \alpha^3, \ldots, \alpha^{2t}$ are roots of c(x), an initial component syndrome may be calculated as:

$$S_i = r(\alpha^{i+1}) = e(\alpha^{i+1})$$

for $i=0,1,\ldots,2t-1$.

The error locator polynomial generator uses the syndromes $S_0, S_1, S_{2t-1}$ to generate the error location polynomial $\Lambda(x)$, which is defined as:

$$\Lambda(x) = \Pi_{i=1}^{v}(1-a^{j_i}x)$$

Several methods exist in the art for finding the locator polynomial. For example, Berlekamp-Massey algorithm, Peterson's algorithm, and the like. The roots of the error location polynomial (i.e., $j_0, j_1, j_v$ in the equation above) indicate the locations of the errors, so finding the roots of the error location polynomial corresponds to finding the locations of the errors in a corresponding codeword.

Roots of the error location polynomial is usually found using Chien search. For binary symbols, once the error locations have been identified, correction simply involves flipping the bit at each identified error location. For non-binary symbols, the error magnitude needs to be calculated, for example, using Forney Algorithm, to find out the magnitude of the correction to be made.

Figure 9:
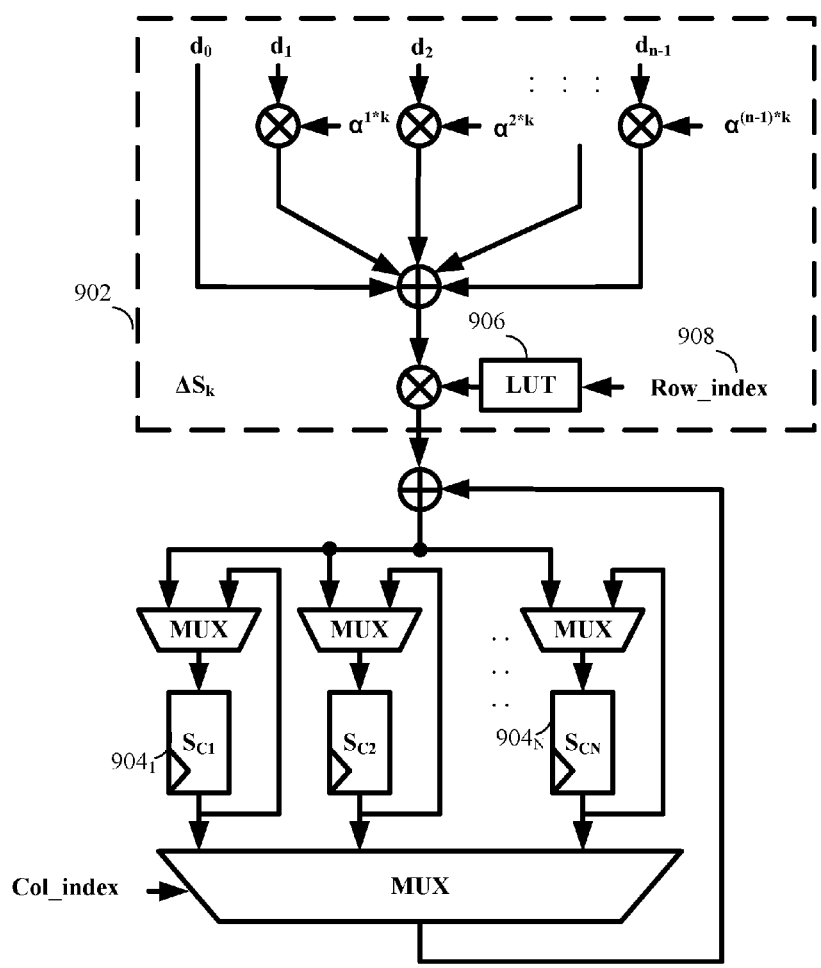
FIG. 9 illustrates an example syndrome updater architecture for decoding a BCH code, in accordance with certain embodiments of the present disclosure.

It should be noted that the proposed code reconstruction scheme provides improvements in at least the following processing blocks in a multi-rate TPC decoder hardware: Initial syndrome calculator, Chien search, and Syndrome updater. For example, FIG. 9 illustrates an example syndrome updater architecture for decoding a BCH code, in accordance with certain embodiments of the present disclosure. In this architecture, the syndrome updater updates the syndrome values based on the following equation:

$$\Delta S_k = (\Sigma_{i=0}^{n-1} d_i \times \alpha^{ik}) \times LUT(RowIndex),$$

where $\Delta S_k$ is the difference between the old value and the updated value of the k-th syndrome bit; RowIndex is the index of the row codeword; $d_i$ is the i-th bit of the row-column intersection; a is the primitive element of the Galois field; LUT is the look-up table that provides the adjustment factor for all row/column codewords.

In the syndrome updater architecture, block 902 generates value of $\Delta S_k$, for each syndrome value $S_k$. Values of $\Delta S_k$ may then be added to the value of $S_k$ to generate updated syndrome values, which are then stored in $S_{C1}$ 904$_1$ through $S_{CN}$ 904$_N$ syndrome memory blocks. A look up table (LUT) 906 is usually used to generate/adjust updated syndrome values corresponding to location of bit (e.g., row index values 908). Without the code reconstruction scheme presented herein, N different look up tables are needed for N different code rates because of different codeword lengths. For example, each supported code rate should use a customized version of the LUT 906 if the codes are not reconstructed. However, by utilizing the code reconstruction method disclosed herein, a single LUT can be shared between constituent codes with different code rates. Therefore, one embodiment reduces total number of required LUTs in the syndrome updater block in the multi-rate TPC decoder from s×t to t, where s is the number of supporting code rate codes.

Figure 10:
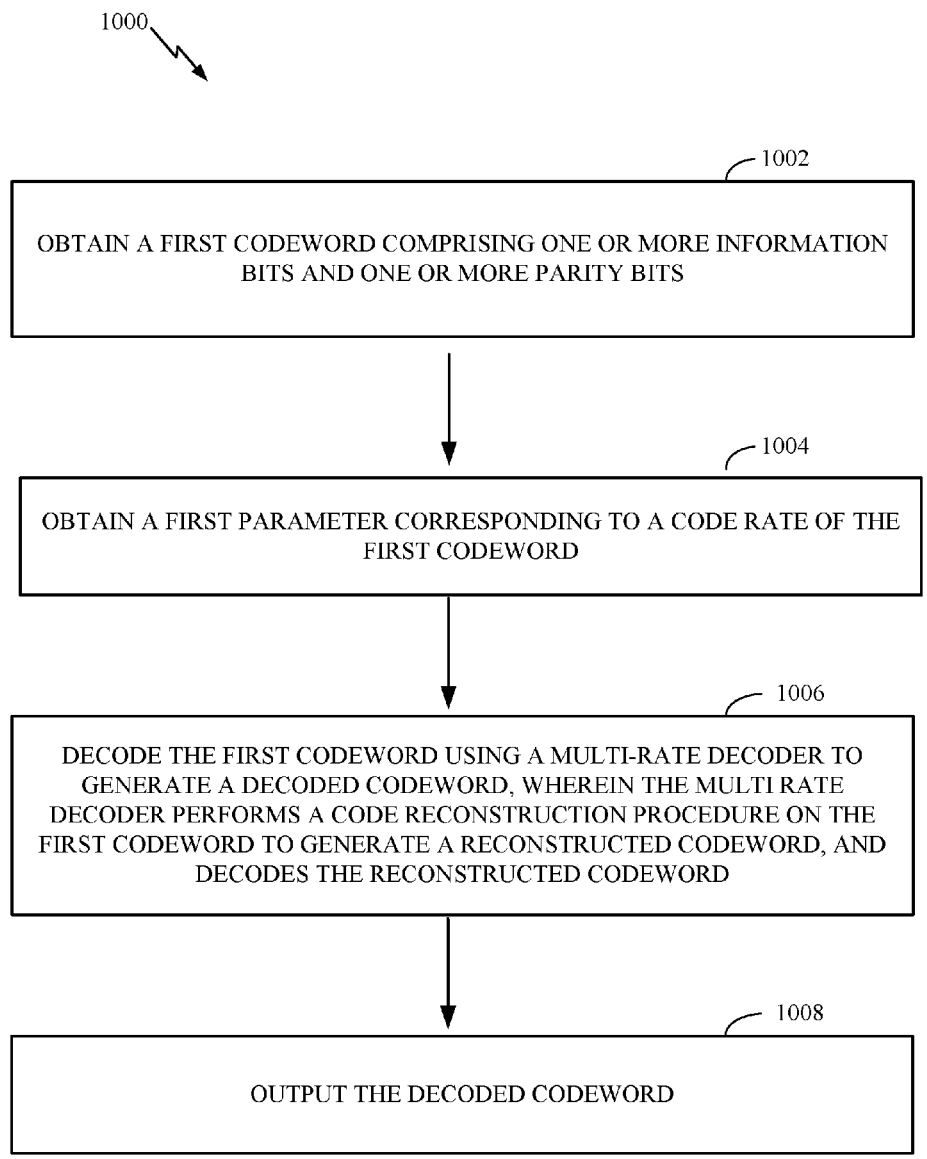
FIG. 10 illustrates example operations that may be performed by a device to construct a codeword, in accordance with certain embodiments of the present disclosure.

FIG. 10 illustrates example operations that may be performed by a device to decode a codeword, in accordance with certain embodiments of the present disclosure. At 1002, the device obtains a first codeword comprising one or more information bits and one or more parity bits. In one embodiment, the first codeword is a TPC codeword. In another embodiment, the first codeword is a BCH codeword. In general, the codeword may correspond to any type of error correcting codes without departing from the teachings of the present disclosure. At 1004, the device obtains a first parameter corresponding to a code rate of the first codeword. In one embodiment, a user may input the first parameter into the device and notify the device of the code rate. In another embodiment, the device may determine the first parameter based on the information that has previously obtained from the system and/or other devices. At 1006, the device decodes the first codeword using a multi-rate decoder to generate a decoded codeword. The multi rate decoder performs a code reconstruction procedure on the first codeword to generate a reconstructed codeword, and decodes the reconstructed codeword. At 1008, the device outputs the decoded codeword.

In one embodiment, the code reconstruction procedure is based at least on the first parameter and a code rate of a base code. In one example, the base code has the lowest supported code rate of the multi-rate decoder. It should be noted that the base code may have any code rate without departing from the teachings of the present disclosure.

In one embodiment, the code reconstruction procedure may include adding one or more zero bits (e.g., zero padding, shortening bits, etc.) to the first codeword to generate an intermediate codeword. The zero bits may be added to the codeword to change the block length of the codeword. In addition, the code construction procedure may determine a second parameter corresponding to number of bit locations that the intermediate codeword is to be cyclically shifted in a first direction based on the first parameter and a code rate of the base code. For example, the code reconstruction procedure may determine that a codeword needs to be shifted to the left ten bit locations to align the starting bit location of the information bits in the first codeword with a predefined bit location. In one example, the predefined bit location corresponds to starting bit location of information bits in the base code of the multi-rate decoder. Furthermore, the code reconstruction procedure cyclically shifts the intermediate codeword based on the value of the second parameter to generate the reconstructed codeword.

Figure 11:
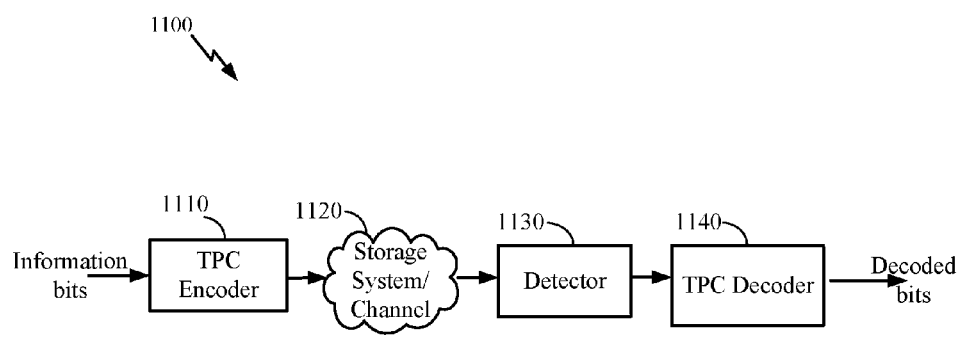
FIG. 11 illustrates an example high level block diagram of a TPC error correcting system, in accordance with certain embodiments of the present disclosure.

FIG. 11 illustrates an example high level block diagram of a TPC error correcting system, in accordance with certain embodiments of the present disclosure. In the example shown, TPC encoder 1110 receives information bits that include data which is desired to be stored in a storage system 1120 or transmitted in a communications channel. TPC encoded data is output by TPC encoder 1110 and is written to storage 1120. In various embodiments, storage 1120 may include a variety of storage types or media, such as magnetic disk drive storage, Flash storage, etc. In some embodiments, the techniques described herein are employed in a transceiver and instead of being written to or read from storage, the data is transmitted and received over a channel (e.g., wired or wireless). In this case, the errors in the received codeword may be introduced during transmission of the codeword.

When the stored data is requested, detector 1130 receives the data from the storage system. The received data may include some noise or errors. Detector 1130 performs detection on the received data and outputs decision and/or reliability information corresponding to one or more bits in a codeword. For example, a soft-output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure the detector is in that decision (e.g., a large magnitude indicates a high reliability or certainty).

The decision and/or reliability information is passed to TPC decoder 1140 which performs TPC decoding using the decision and/or reliability information. A soft input decoder utilizes both the decision and the reliability information to decode the codeword. A hard decoder utilizes only the decision values in the decoder to decode the codeword. After decoding, the decoded bits generated by TPC decoder are passed to the appropriate entity (e.g., the user or application which requested it). With proper encoding and decoding, the information bits match the decoded bits.

Figure 12:
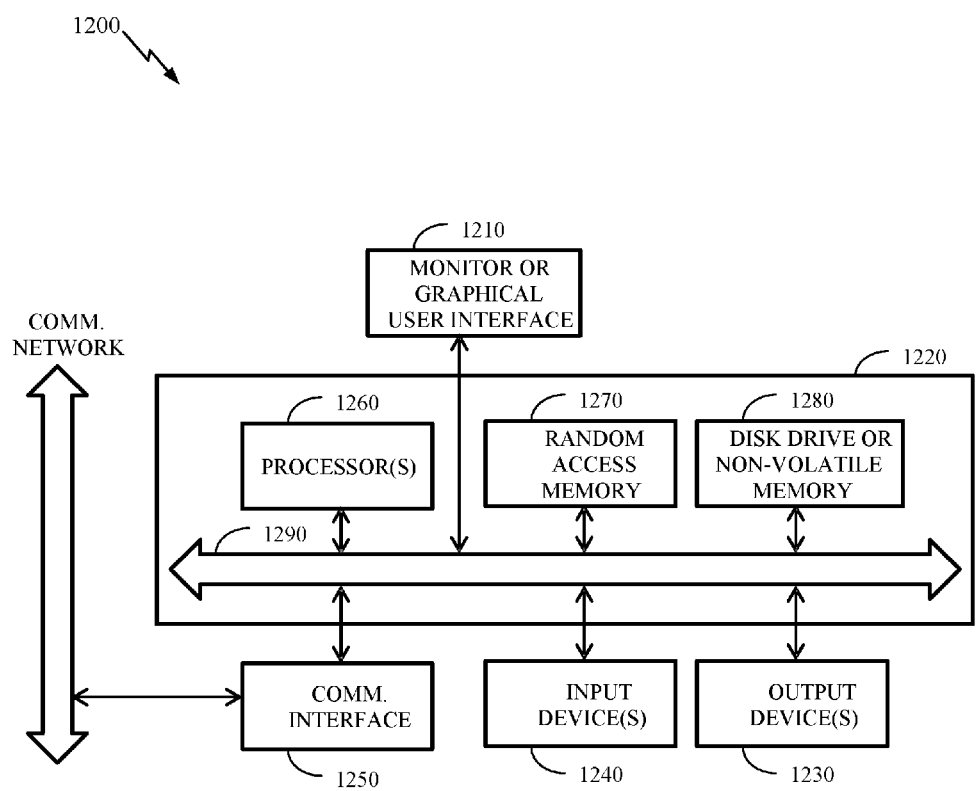
FIG. 12 describes one potential implementation of a device which may be used to design and decode codewords, according to one embodiment.

FIG. 12 describes one potential implementation of a device which may be used to reconstruct and decode codewords, according to one embodiment. FIG. 12 is merely illustrative of an embodiment incorporating the present invention and does not limit the scope of the invention as recited in the claims. One of ordinary skill in the art would recognize other variations, modifications, and alternatives. In one embodiment, computer system 1200 typically includes a monitor 1210, a computer 1220, user output devices 1230, user input devices 1240, communications interface 1250, and the like.

As shown in FIG. 12, computer 1220 may include a processor(s) 1260 that communicates with a number of peripheral devices via a bus subsystem 1290. These peripheral devices may include user output devices 1230, user input devices 1240, communications interface 1250, and a storage subsystem, such as random access memory (RAM) 1270 and disk drive 1280.

User input devices 1230 include all possible types of devices and mechanisms for inputting information to computer system 1220. These may include a keyboard, a keypad, a touch screen incorporated into the display, audio input devices such as voice recognition systems, microphones, and other types of input devices. In various embodiments, user input devices 1230 are typically embodied as a computer mouse, a trackball, a track pad, a joystick, wireless remote, drawing tablet, voice command system, eye tracking system, and the like. User input devices 1230 typically allow a user to select objects, icons, text and the like that appear on the monitor 1210 via a command such as a click of a button or the like.

User output devices 1240 include all possible types of devices and mechanisms for outputting information from computer 1220. These may include a display (e.g., monitor 1210), non-visual displays such as audio output devices, etc.

Communications interface 1250 provides an interface to other communication networks and devices. Communications interface 1250 may serve as an interface for receiving data from and transmitting data to other systems. Embodiments of communications interface 1250 typically include an Ethernet card, a modem (telephone, satellite, cable, ISDN), (asynchronous) digital subscriber line (DSL) unit, FireWire interface, USB interface, and the like. For example, communications interface 1250 may be coupled to a computer network, to a FireWire bus, or the like. In other embodiments, communications interfaces 1250 may be physically integrated on the motherboard of computer 1220, and may be a software program, such as soft DSL, or the like.

In various embodiments, computer system 1200 may also include software that enables communications over a network such as the HTTP, TCP/IP, RTP/RTSP protocols, and the like. In alternative embodiments of the present invention, other communications software and transfer protocols may also be used, for example IPX, UDP or the like. In some embodiments, computer 1220 includes one or more Xeon microprocessors from Intel as processor(s) 1260. Further, one embodiment, computer 1220 includes a UNIX-based operating system.

RAM 1270 and disk drive 1280 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. RAM 1270 and disk drive 1280 may be configured to store the basic programming and data constructs that provide the functionality of the present invention.

Software code modules and instructions that provide the functionality of the present invention may be stored in RAM 1270 and disk drive 1280. These software modules may be executed by processor(s) 1260. RAM 1270 and disk drive 1280 may also provide a repository for storing data used in accordance with the present invention.

RAM 1270 and disk drive 1280 may include a number of memories including a main random access memory (RAM) for storage of instructions and data during program execution and a read only memory (ROM) in which fixed non-transitory instructions are stored. RAM 1270 and disk drive 1280 may include a file storage subsystem providing persistent (non-volatile) storage for program and data files. RAM 1270 and disk drive 1280 may also include removable storage systems, such as removable flash memory.

Bus subsystem 1290 provides a mechanism for letting the various components and subsystems of computer 1220 communicate with each other as intended. Although bus subsystem 1290 is shown schematically as a single bus, alternative embodiments of the bus subsystem may utilize multiple busses.

FIG. 12 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An apparatus for decoding, comprising:
  a memory;
  at least one processor coupled to the memory, the at least one processor configured to:
    obtain a first codeword comprising one or more information bits and one or more parity bits;

obtain a first parameter corresponding to a code rate of the first codeword;

decode the first codeword using a multi-rate decoder to generate a decoded codeword, wherein the multi rate decoder performs a code reconstruction procedure on the first codeword to generate a reconstructed codeword, wherein the code reconstruction procedure is based at least on the first parameter, and wherein the multi rate decoder supports multiple code rates with a lookup table and decodes the reconstructed codeword based at least on the lookup table; and output the decoded codeword.

2. The apparatus of claim 1, wherein the first codeword corresponds to a turbo product code (TPC).

3. The apparatus of claim 1, wherein the code reconstruction procedure is based at least on the first parameter and a code rate of a base code.

4. The apparatus of claim 3, wherein the base code comprises a base code rate, wherein the base code rate corresponds to the lowest supported code rate by the multi-rate decoder.

5. The apparatus of claim 4, wherein the processor configured to perform code reconstruction procedure is further configured to:

add one or more zero bits to the first codeword to generate an intermediate codeword;

determine a second parameter corresponding to a number of bit locations that the intermediate codeword is to be cyclically shifted in a first direction based on the first parameter and a code rate of the base code rate; and cyclically shift the intermediate codeword based on a value of the second parameter to generate the reconstructed codeword.

6. The apparatus of claim 1, wherein a starting bit location of the one or more information bits in a second codeword is aligned with a predetermined bit location.

7. The apparatus of claim 6, wherein the predetermined bit location corresponds to a starting bit location of information bits in a base code of the multi-rate decoder.

8. The apparatus of claim 1, wherein the first codeword comprises a Bose-Chaudhuri-Hocquenghem (BCH) code.

9. A method for decoding, comprising:

obtaining, by a system, a first codeword comprising one or more information bits and one or more parity bits from a memory;

obtaining, by the system, a first parameter corresponding to a code rate of the first codeword;

generating a decoded codeword using a multi-rate decoder and the first codeword;

reconstructing the first codeword, wherein the reconstructing generates a reconstructed codeword by using the multi rate decoder to reconstruct the first codeword based at least on the first parameter, and wherein the multi rate decoder supports multiple code rates with a lookup table and decodes the reconstructed codeword based at least on the lookup table; and outputting, by the system, the decoded codeword.

10. The method of claim 9, wherein the first codeword corresponds to a turbo product code (TPC).

11. The method of claim 9, wherein reconstructing the first codeword is based at least on the first parameter and a code rate of a base code.

12. The method of claim 11, wherein the base code comprises a base code rate, wherein the base code rate corresponds to the lowest supported code rate by the multi-rate decoder.

13. The method of claim 12, further comprising:

adding, by the system, one or more zero bits to the first codeword to generate an intermediate codeword;

determining, by the system, a second parameter corresponding to a number of bit locations that the intermediate codeword is to be cyclically shifted in a first direction based on the first parameter and a code rate of the base code rate; and cyclically, by the system, shifting the intermediate codeword based on a value of the second parameter to generate the reconstructed codeword.

14. The method of claim 9, wherein a starting bit location of the one or more information bits in a second codeword is aligned with a predetermined bit location.

15. The method of claim 14, wherein the predetermined bit location corresponds to a starting bit location of information bits in a base code of the multi-rate decoder.

16. The method of claim 9, wherein the first codeword comprises a Bose-Chaudhuri-Hocquenghem (BCH) code.

17. The method of claim 9, wherein the lookup table indicates an adjustments to syndrome values based on bit locations, and wherein the lookup table associates an adjustment factor with a code rate, and wherein reconstructing the first codeword comprises adjusting, by the multi-rate decoder, a syndrome value of the first codeword based at least on the lookup table.

18. A non-transitory computer-readable storage medium comprising instructions that, upon execution by a processor of a computing device, configure the computing device to perform operations comprising:

obtaining a first codeword comprising one or more information bits and one or more parity bits;

obtaining a first parameter corresponding to a code rate of the first codeword;

decoding the first codeword using a multi-rate decoder to generate a decoded codeword, wherein the multi rate decoder performs a code reconstruction procedure on the first codeword to generate a reconstructed codeword, wherein the code reconstruction procedure is based at least on the first parameter, and wherein the multi rate decoder supports multiple code rates with a lookup table and decodes the reconstructed codeword based at least on a lookup table; and outputting the decoded codeword.

19. The non-transitory computer-readable storage medium of claim 18, wherein the operations further comprise:

adding, by the computing device, one or more zero bits to the first codeword to generate an intermediate codeword;

determining, by the computing device, a second parameter corresponding to a number of bit locations that the intermediate codeword is to be cyclically shifted in a first direction based on the first parameter and a code rate of a base code rate; and cyclically, by the computing device, shifting the intermediate codeword based on a value of the second parameter to generate the reconstructed codeword.

20. The non-transitory computer-readable storage medium of claim 18, wherein a starting bit location of the one or more information bits in a second codeword is aligned with a predetermined bit location.

* * * * *